United States Patent
Droz (10) Patent No.: US 8,528,824 B2
(45) Date of Patent: Sep. 10, 2013

(54) METHOD OF MANUFACTURING CARDS COMPRISING AT LEAST ONE ELECTRONIC MODULE, ASSEMBLY PRODUCED DURING THIS METHOD AND INTERMEDIATE PRODUCTS

(75) Inventor: François Droz, Corcelles (CH)

(73) Assignee: NagraID S.A., La Chaux-de-Fonds (CH)

( * ) Notice: Subject to any disclaimer, the term of this patent is extended or adjusted under 35 U.S.C. 154(b) by 674 days.

(21) Appl. No.: 12/305,577

(22) PCT Filed: Jun. 5, 2007

(86) PCT No.: PCT/EP2007/055530
§ 371 (c)(1),
(2), (4) Date: Dec. 1, 2009

(87) PCT Pub. No.: WO2007/147729
PCT Pub. Date: Dec. 27, 2007

(65) Prior Publication Data
US 2010/0090009 A1    Apr. 15, 2010

(30) Foreign Application Priority Data

Jun. 19, 2006 (EP) .................................... 06012550
Oct. 5, 2006 (WO) ................. PCT/EP2006/009663

(51) Int. Cl.
*G06K 19/02* (2006.01)

(52) U.S. Cl.
USPC ............................. 235/488; 235/493; 235/492

(58) Field of Classification Search
USPC ................................................ 235/488, 492
See application file for complete search history.

(56) References Cited

U.S. PATENT DOCUMENTS 4,990,759 A   2/1991   Gloton et al.
5,272,374 A   12/1993  Kodai et al.
(Continued)

FOREIGN PATENT DOCUMENTS

EP    0570784 A1    11/1993
EP    0789323 A2    8/1997
(Continued)

OTHER PUBLICATIONS

International Search Report issued in priority application PCT/EP2006/00963 completed on Feb. 2, 2007 and mailed Mar. 28, 2007.

(Continued)

*Primary Examiner* — Thien M Le
*Assistant Examiner* — Sonji Johnson
(74) *Attorney, Agent, or Firm* — Griffin & Szipl, P.C.

(57) ABSTRACT

The assembly (22) involved in the fabrication of electronic cards comprises a plate (14) exhibiting a plurality of apertures (16) in which are respectively housed a plurality of electronic modules (2). These electronic modules are assembled to the plate 14 by fixing means, in particular by fixing bridges leaving a slot (26) over the major part of the surround of the electronic module. For example the fixing means are formed by projecting parts (18) at the periphery of the apertures (16), these projecting parts exhibiting a smaller thickness than the thickness of the plate (14) and serving as supports for the electronic modules, in particular for a substrate (12) of these modules. Fixing is performed for example by welding or adhesive bonding. The invention also relates to an intermediate product formed by such an assembly and a filing material that fills at least the major part of the remaining space in the apertures (16). The invention also relates to a method of fabricating cards in which the assembly according to the invention is finally coated in a resin to form substantially plane cards.

37 Claims, 8 Drawing Sheets

(56) References Cited

U.S. PATENT DOCUMENTS

| | | | |
|---|---|---|---|
| 5,399,847 | A | 3/1995 | Droz |
| 6,206,291 | B1 | 3/2001 | Droz |
| 6,239,976 | B1 | 5/2001 | Templeton et al. |
| 6,467,692 | B1 | 10/2002 | Tarantino et al. |
| 6,843,422 | B2 | 1/2005 | Jones et al. |
| 7,770,517 | B2 | 8/2010 | Ohsawa |
| 2002/0129970 | A1* | 9/2002 | Murohara .................... 174/255 |
| 2003/0226899 | A1 | 12/2003 | Finkelstein |
| 2004/0041262 | A1 | 3/2004 | Okamoto et al. |
| 2004/0256466 | A1* | 12/2004 | Droz ............................ 235/492 |
| 2004/0256469 | A1 | 12/2004 | Faenza et al. |
| 2005/0019989 | A1 | 1/2005 | Droz |
| 2007/0004100 | A1 | 1/2007 | Maekawa et al. |

FOREIGN PATENT DOCUMENTS

| | | |
|---|---|---|
| WO | 03/056500 A | 7/2003 |
| WO | 03/090151 A | 10/2003 |
| WO | 2004/068395 A | 8/2004 |
| WO | 2004/074000 A | 9/2004 |
| WO | 2004/102469 | 9/2004 |

OTHER PUBLICATIONS

Haghiri, Yahya et al., "7.2 Kontaklose Chipkaret (Laminiertechnik)," Vom Plastik zur Chipkarte, 1999, pp. 181-192.

International Search Report issued in corresponding application No. PCT/EP2007/055530, completed Sep. 27, 2008 and mailed Oct. 9, 2007.

Finkenzeller, Klaus, "12 Herstellung von Transpondern und kontaklosen Chipkarten," RFID Handbuch, Sep. 26, 2002, pp. 341-351.

Office Action issued in co-pending related U.S. Appl. No. 12/305,618 on Feb. 1, 2012.

Office Action issued Jul. 23, 2012 in co-pending related U.S. Appl. No. 13/451,849.

Office Action issued in co-pending related U.S. Appl. No. 12/526,382 on Feb. 1, 2013.

Fundamentals of Machining/Orthogonal Machining, Materials and Processes in Manufacturing 480-81 (9th ed.), 2003.

* cited by examiner

METHOD OF MANUFACTURING CARDS COMPRISING AT LEAST ONE ELECTRONIC MODULE, ASSEMBLY PRODUCED DURING THIS METHOD AND INTERMEDIATE PRODUCTS

This is a National Phase Application in the United States of International Patent Application No. PCT/EP2007/055530 filed Jun. 5, 2007, which claims priority on European Patent Application No. 06012550.7, filed Jun. 19, 2006 and International Patent Application PCT/EP2006/008552, filed Oct. 5, 2006. The entire disclosures of the above patent applications are hereby incorporated by reference.

FIELD OF THE INVENTION

The present invention concerns a method of manufacturing cards that each include an electronic module, in particular, an electronic module comprising an electronic display. The card obtained from the method according to the invention is, for example, a bankcard, in particular, which conforms to the ISO standard. However, the present invention can also apply to electronic cards whose general profile is not rectangular, particularly circular cards. The present invention also concerns assemblies and intermediate products obtained within the scope of the method according to the invention.

BACKGROUND OF THE INVENTION

Figure 1:
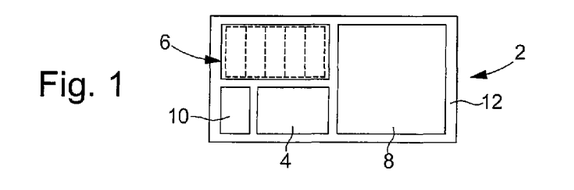
FIG. 1, already described, shows schematically an electronic module that can be integrated in a card according to the method of the present invention.

Electronic cards or integrated circuit cards have considerably developed over the last few years. Initially, electronic cards were formed of a card body including a resistive contact module housed in a recess in the body of the card. Then, contactless cards were made, i.e. cards including a transponder formed of an electronic circuit connected to an antenna. As electronic cards develop, it is sought to integrate other electronic elements for other functions into the cards. By way of example, cards including a switch that can be activated by the user and an electronic display have been disclosed. Such cards generally require relatively large batteries or powering means of the photovoltaic cell type. In order to integrate these various elements in a card, they are generally grouped together in the form of at least one electronic module, including a support or substrate, on the surface of which various electronic elements are arranged. FIG. 1 shows a schematic example of this type of module. Module 2 includes an integrated circuit 4, connected to an electronic display 6, a battery 8 and an activator 10, arranged on a support 12, forming a PCB interconnecting these various elements. In order to limit the thickness of these modules, the battery and/or the display can be arranged at the periphery of support 12 or in recesses therein.

It is not easy to integrate a relatively large electronic module, made up of various elements of variable shape and size, in a card. Further, integrating a digital display, which has to be precisely positioned in the manufactured card, causes an additional problem, which the present invention proposes to overcome.

EP Patent No. 0 570 784 discloses, in one implementation, a method of manufacturing cards including an electronic assembly, in particular, a transponder, which is placed in a main aperture of a positioning frame. According to the implementation disclosed, the transponder and the positioning frame are embedded in a binding agent that can be added in viscous liquid form, particularly a resin. In EP Patent No. 0 570 784, the positioning frame is only used for delimiting an inner zone for the transponder, formed of an integrated circuit and a coil, inside the card. Thus, when pressure is applied to the various elements and the binding agent to form a card, the transponder is held in an inner zone, whereas it is possible for the binding agent, in a non-solid state, to spread out on to form a layer that passes through the manufactured card. Those skilled in the art can find, in this Patent document, a method for integrating a relatively large and complex-shaped electronic module in a compact, flat card. However, the electronic module placed in the main aperture of a positioning frame, as described in that document, will often be moved slightly when the card is being formed. Indeed, this document does not disclose how to maintain the transponder in a precise, determined position inside the aperture of the positioning frame. Those skilled in the art might certainly think of reducing the dimensions of the main aperture to make them approximately match the dimensions of the electronic module, in particular the external profile of the module. However, manufacturing tolerances must be taken into account, so that it is difficult to envisage too tight a fit. Moreover, depending upon the way in which the modules are manufactured, the positioning of the various elements on the support may also vary slightly. Thus, for example, digital display 6 is arranged on the surface of the PCB or at the periphery thereof in a position that may vary slightly. However, to obtain a high quality card, this digital display must be positioned precisely relative to the external contour of the manufactured card. This is particular important when a transparent aperture, which fits the dimensions of the digital display, is arranged above the digital display to allow the user of the card to read the display.

There is a further problem in addition to this problem of positioning the electronic module relative to the external contour of the card. This problem concerns introducing the electronic module within the card manufacturing installation. It will be noted here that electronic cards are generally manufactured in batches, i.e. several cards are manufactured simultaneously in the form of a plate that includes a plurality of electronic modules. Then, each card is separated from the obtained plate during a cutting step, as is described in EP Patent No. 0 570 784. Within the scope of the embodiments described in the latter disclosure, the transponder remains free in relation to the positioning frame until the card is formed. This requires precautions in the handling of the various elements brought to form the card, to ensure that the transponders remain in the corresponding apertures in the positioning structure until the press is activated.

The present invention thus also proposes to answer this latter problem, in order to simplify the provision of electronic modules, while ensuring that the electronic modules are held in the apertures of a positioning structure and to facilitate assembly of the various elements and materials provided for manufacturing the cards.

Therefore, the present invention concerns, firstly, an assembly produced during the manufacture of cards, which each include an electronic module. The card manufacturing process includes the provision of a plate, which has at least one, at least partially through aperture, and at least one electronic module, which is electrically independent of said plate and housed, at least partially, in said at least one aperture, in an installation where a resin is added to at least one side of said electronic module, said plate forming a positioning structure for said electronic module. This assembly includes said plate and said at least one electronic module and is characterized in that, before said assembly is brought to said installation, said plate and said at least one electronic module are assembled in a sufficiently rigid manner for said at least one electronic module to remain in a substantially defined position relative to said plate, firstly until the resin is added, and subsequently during said resin is added.

It should be noted that the resin could be added in various forms and in various states. The term "resin" should be understood in a broad sense, including various known adhesives, PVC and Polyurethane resins or other resins available to those skilled in the art.

In a preferred embodiment, each aperture and/or the electronic module located in said aperture are arranged such that a space remains in the aperture, and open on at least one side of the plate. The card or intermediate product manufacturing process then includes a step where a filling material is introduced into this space remaining in the apertures.

Assembling the plate pierced with apertures and electronic modules in a preliminary step of the card manufacturing method has numerous advantages and answers the aforementioned problem. The fact that a material connection is made between the electronic module and the plate means that the assembly can be handled, in particular, via the plate, in order to implement subsequent steps in the card manufacturing method. The assembly according to the invention resolves the problem of holding the electronic modules in the apertures of the plate, when the plate and electronic modules are brought into an installation where a resin is added in accordance with the card or intermediate product manufacturing method of the invention.

In the preferred embodiment, wherein a space remains in the apertures of the pierced plate after the assembly according to the invention has been assembled, the spaces remaining in the apertures are generally filled with a filling material or a resin by applying pressure, particular using a press or a roller that spreads out the filling material or resin. If no particular precautions are taken, this step may move the electronic modules relative to the frame. The assembly according to the present invention resolves this problem in an advantageous manner, by maintaining the modules in a precise position during the entire card manufacturing method; both in the general plane of the plate and along the axis perpendicular to the general plane.

The present invention also concerns an intermediate product of the card manufacturing process, which comprises an assembly according to the aforementioned preferred embodiment, and a filling material, which fills at least most of the space remaining in the plate apertures where the electronic modules are situated. The top and bottom surfaces of this intermediate product are preferably more or less flat. In a first variant, the thickness of the intermediate product is approximately the same as said plate, the filling material being essentially provided in the spaces remaining in the plate apertures. In a second variant, the filling material is formed by a resin, which covers at least one of the top and bottom surfaces of the plate. In this latter case, the intermediate product has improved rigidity, because the resin covers at least one side of the plate and preferably both sides.

If the resin covers both sides of the plate and the electronic modules, the intermediate product can already be used as a card, when the outer surfaces are approximately flat. However, there are several advantages to making the intermediate product according to the invention in a card manufacturing method that includes at least one further step of adding resin to both sides of the intermediate product. The present invention also concerns this manufacturing method. According to this method of manufacturing at least one card, an intermediate product, as defined above, is made, and then the resin is deposited on at least one of the top and bottom surfaces of the intermediate product. Finally, pressure is applied to the deposited resin, which is then in a non-solid state, to form at least one card that has a flat outer surface, since the resin deposited on the intermediate product fills in any variations in thickness in the intermediate product. The resin deposited on the intermediate product preferably forms a thin layer. The resin can be added in a single step or in several successive steps to further improve flatness.

This method is particularly advantageous for obtaining cards which have a perfectly flat surface and which incorporate a relatively large electronic module that has variations in thickness and is formed of various elements. In fact, when the electronic module is formed of various elements, made of different materials and with different levels of thickness and empty intermediate zones, the filling material or resin added to the remaining space in the plate aperture is distributed in an irregular manner, with variations in thickness. When the filling material or resin hardens, shrinkage, and thus a variation in thickness, may occur in the resin, which then generates a surface with slight hollows or bumps. The surface state of the intermediate product generally does not meet the bankcard standards, but the variations in thickness can be removed, by subsequently depositing a resin film on both sides of the intermediate product, when the finished cards are formed. The cards then have perfectly flat outer surfaces.

SUMMARY OF THE INVENTION

Generally, the invention concerns a method of manufacturing at least one intermediate product or at least one card including the following steps:

making an assembly according to the preferred embodiment of the invention described above, said assembly including a plate that has at least one aperture and at least one electronic module arranged, at least partially, in said aperture, said plate and said at least one electronic module being assembled, before a filling material is added to the remaining space in said at least one aperture, in a sufficiently rigid manner to hold said at least one electronic module in said at least one aperture, in a substantially fixed position relative to said plate, prior to and during the following step of:

adding a filling material and introducing said filling material in a viscous liquid state into said remaining space in said at least one aperture;

solidifying said filling material.

According to a preferred variant, the method is characterized in that a resin is deposited over at least one of the bottom and top surfaces of said plate, at least on the side where the filling material was introduced into said at least one aperture in said plate. According to a preferred variant, the filling material is identical to the resin and is added simultaneously.

According to a particular feature of the method described above, the resin is spread out using at least one roller or one blade, which moves relative to the plate-electronic module assembly. An intermediate product or card with more or less flat outer surfaces is thus obtained.

BRIEF DESCRIPTION OF THE DRAWINGS

Other advantages and particular features of the assembly of the invention, of the method according to the present invention, and intermediate products obtained within the scope of the method, will appear more clearly upon reading the following description of embodiments of said assembly and said intermediate product, in addition to implementations of the intermediate product or card manufacturing method, which are given by way of non-limiting example. The description refers to the illustrative drawings, in which.

DETAILED DESCRIPTION OF THE ILLUSTRATIVE EMBODIMENTS

Figure 2:
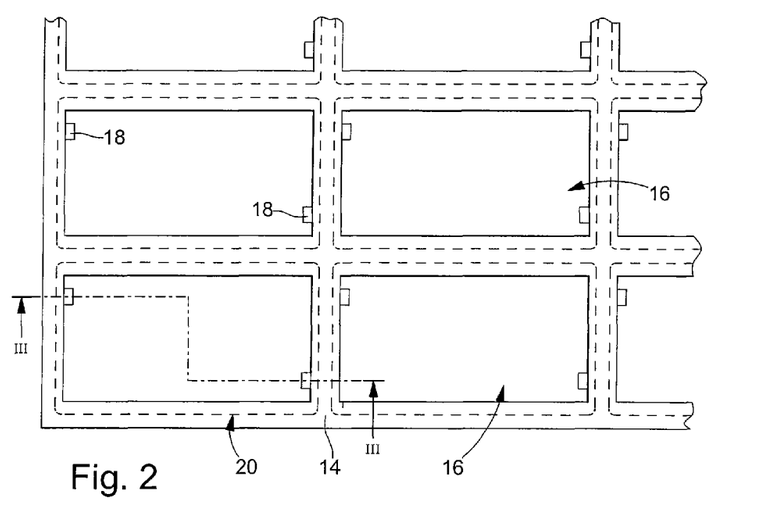
FIG. 2 shows a plate involved in a first embodiment of an assembly in accordance with the present invention.
Figure 3A:
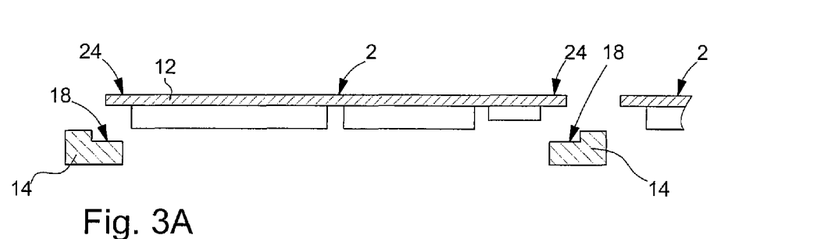
FIG. 3A shows an electronic module being brought into an aperture of the plate of FIG. 2.
Figure 3B:
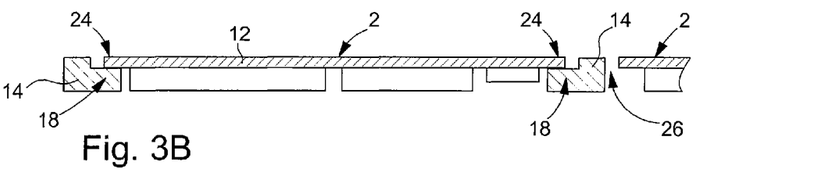
FIG. 3B shows a partial cross-section of a first embodiment of an assembly according to the invention.
Figure 4:
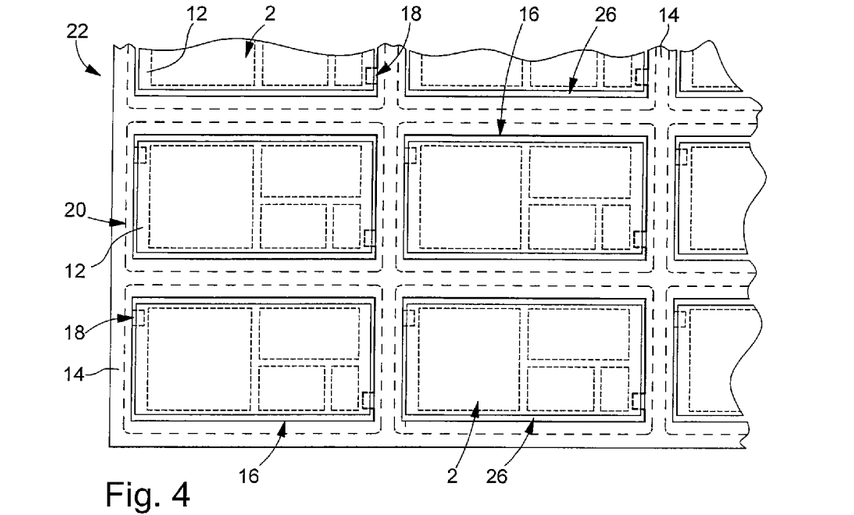
FIG. 4 is a partial top view of the first embodiment of an assembly according to the invention.

With reference to FIGS. 2 to 4, we will now describe a first embodiment of an assembly according to the invention, which is produced in a card manufacturing method, also in accordance with the invention. The method of the invention is particularly well suited to manufacturing cards in batches, i.e. manufacturing several cards simultaneously. The assembly 22 shown partially in FIG. 4 includes several electronic modules 2 for manufacturing several batches of cards. However, it will be noted that the present invention is not limited to the batch manufacture of cards, but can also, in a particular variant, apply to card-by-card manufacture, i.e. individual card manufacture.

Assembly 22 includes a plate 14 that has at least one, at least partially through aperture 16, and at least one electronic module 2 at least partially housed in said at least one aperture 16. In the example shown in FIG. 2, plate 14 has a plurality of through apertures 16 and defines as many frames for electronic modules 2 as there are modules housed in said apertures 16. The plate defines a positioning structure for the electronic modules. According to the invention, projecting portions 18 are arranged at the periphery of each aperture 16. In the variant shown in FIGS. 2 to 4, two projecting portions 18 are arranged on two opposite sides of aperture 16, substantially along a diagonal of said aperture. It will be noted, however, that there can be any number of projecting parts and they can be arranged anywhere along the periphery of each aperture 16. Preferably, at least two projecting portions are provided in each aperture 16. These projecting portions form stop members for the electronic modules inserted in the apertures.

FIGS. 2 and 4 show, in dotted lines 20, the final periphery of each card obtained from the manufacturing method of the invention, in which assembly 22 is involved. In a conventional manner, each card obtained is cut out by means known to those skilled in the art. FIG. 3A shows plate 14 in the cross-sectional plane III-III of FIG. 2. The thickness or height of projecting portions 18 is less than that of plate 14. Projecting portions 18 are formed before electronic module 2 is brought, in a variety of manners. These portions can be obtained by hot or cold pressing in a press. They can also be obtained using an ultrasound head or a head generating a high frequency electric field. This provides an initial plate 14 of constant thickness, pierced with apertures 16 that have projecting portions. Next, the thickness of the projecting portions is reduced, by a tool or head acting in a localised manner on these projecting portions. This step can be performed quickly and efficiently using one of the aforementioned means. In another variant of plate 14, the thickness of projecting portions 18 is reduced by machining, in particular by using a milling cutter. In another variant, plate 14 is formed of two layers, laminate welded to each other, the bottom layer including projecting portions 18, whereas the top layer has rectangular apertures that match apertures 16 in the projecting portions. Projecting portions 18 can thus be made by any means known to those skilled in the art.

Once plate 14 has been made, one electronic module 2, which is electrically independent of the plate, is inserted into each aperture 16. The electronic module and all the electrical connections thereof, are made beforehand. In the example described here, module 2 includes a substrate 12, which extends into at least some zones at the edge of said module, beyond the electronic elements 4 to 8 which said module carries. The dimensions and shape of substrate 12 are such that it has two zones 24 which are superposed on the two projecting portions 18, when electronic module 2 is inserted into aperture 16. Thus, substrate 12 abuts against projecting portions 18, as shown in FIG. 3B.

According to the invention, electronic modules 2 are assembled to plate 14 in a sufficiently rigid manner, firstly, so that electronic modules 2 remain in apertures 16 during the card manufacturing method according to the invention, and secondly, so that they approximately maintain the initial position defined when projecting portions 18 are assembled. The electronic module can be positioned when it is inserted into aperture 16 relative to a defined reference on plate 14. This positioning of module 2 relative to plate 14 may concern the module as a whole and thus in particular substrate 12, or it may concern one particular element of the module, in particular electronic display 6. This is particularly advantageous, given that display 6 is, by definition, meant to be visible on one surface of the finished card. Precise positioning of the display relative to the contour 20 of the card is important for aesthetic reasons, and also functional reasons, when the display appears through an aperture in a covering layer of the card. When positioning is required relative to the display, means are provided for marking electronic display 6 and then inserting module 2 in such a way that display 6 is in a determined position relative to plate 14, which thus forms a positioning structure.

Electronic module 2 can be secured to projecting portions 18 in various ways. By way of example, provided that the materials forming the two zones 24 of substrate 12 and projecting portions 18 can adhere directly to each other, said zones 24 are simply heat welded to projecting portions 18, using thermodes. Module 2 can also be secured to plate 14 using an ultrasound head or other means known to those skilled in the art. In another variant, an adhesive film is deposited, either on projecting portions 18, or on zones 24, so as to bond them to each other. In other variants, substrate 12 is secured to projecting portions by adding drops of adhesive or a strip of adhesive between the edge of the substrate and the projecting portions. Any chemical or physical means that assemble module 2 to the projecting portions in a sufficiently rigid manner can be used within the scope of the present invention.

A secure assembly is thus obtained, formed of plate 14 and electronic modules 2, which are housed in apertures 16 of the plate. Two particular, advantageous features of assembly 22 will be noted:

firstly, the thickness of module 2 is substantially identical to the thickness of plate 14, electronic module 2 being entirely housed in the corresponding aperture 16;

secondly, a slot 26 remains between module 2 and the edge of aperture 16, with the exception of the zones where projecting portions 18 are located.

The fact that module 2 is housed entirely inside aperture 16, i.e. in the thickness of plate 14, means that the manufacture of relatively thin cards can be better controlled. This means cards that have the smallest possible increase in thickness relative to the thickness of module 2. The presence of a slot 26 reduces manufacturing tolerances for pierced plate 14 and modules 2 and also allows substrate 12 to be positioned slightly differently from one aperture to another, depending upon the position of the electronic display assembled to the substrate. Moreover, as will become clear below, slots 26 can then be filled by a resin, which thus provides an adherent bridge between substrate 12 and the wall of through aperture 16. This ensures, finally, that electronic module 2 and plate 4 are perfectly secured to each other, such that, when the finished card is bent or subjected to other stress, electronic module 2 follows the deformation of plate 14 properly. This prevents the edges of substrate 12 of module 2 marking the external surfaces of the finished card and thus damaging the aesthetic appearance of the card. It will be noted that the material used, in particular for making substrate 12, is selected so that it can withstand a certain amount of elastic deformation and can allow electronic module 2 to be bent, when the card is subjected to stress, particularly within the scope of tests carried out to ensure compliance with the relevant standards.

Figure 5:
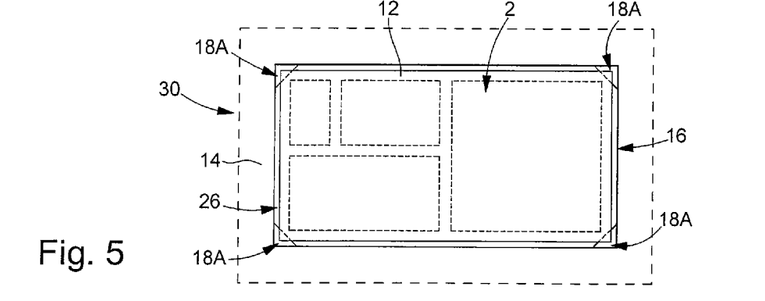
FIGS. 5 and 6 show, respectively, and partially, first and second variants of the first embodiment of said assembly.
Figure 8:
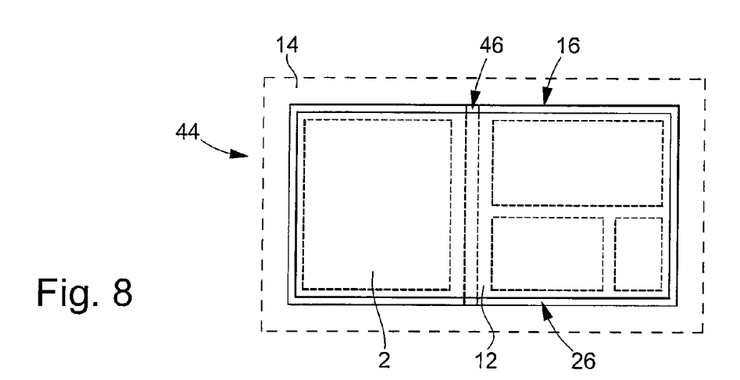
FIG. 8 shows partially a fourth variant of said first embodiment of said assembly.

A first alternative embodiment is shown in FIG. 5, which shows a single aperture 16 of a plate 14, which here has approximately the dimensions of a single card. This simplified diagram, which is also used in FIGS. 6 and 8, is in no way restrictive, and describes an assembly 30, which is similar to assembly 22 of FIG. 4, i.e. for batch manufacturing a plurality of cards.

The variant of FIG. 5 differs in that the projecting portions 18A are formed in the four corners of aperture 16. The portions thus define truncated corners in the bottom area of aperture 16. Projecting portions 18A, which project relative to the generally rectangular shape of aperture 16, can be made by the same, aforementioned techniques. The dimensions of module 2 are such that the four corners of substrate 12 are superposed on the four parts 18A. The electronic module is assembled to plate 14 in a similar manner to the previously described variant.

Figure 6:
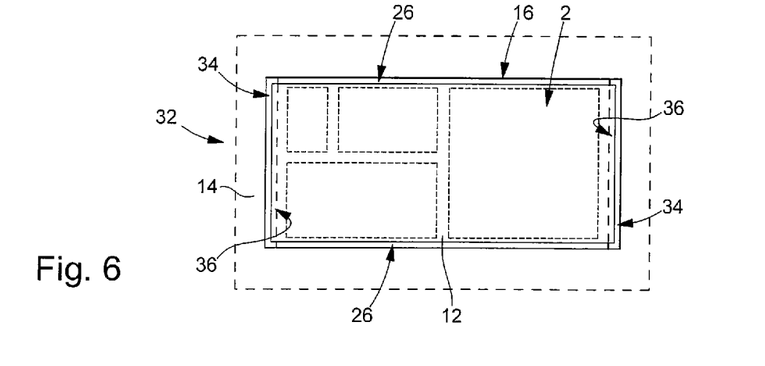

FIG. 6 shows a second alternative embodiment of the assembly according to the invention. This alternative is characterized in that it provides a step 34, which forms an intermediate level against which two lateral zones 36 of substrate 12 abut, along two opposite edges of rectangular aperture 16. Steps 34 can be formed in a similar manner to the projecting portions described in the other variants. The electronic module is assembled to plate 14 by welding or bonding, or by any other physical or chemical means available to those skilled in the art.

Figure 7A:
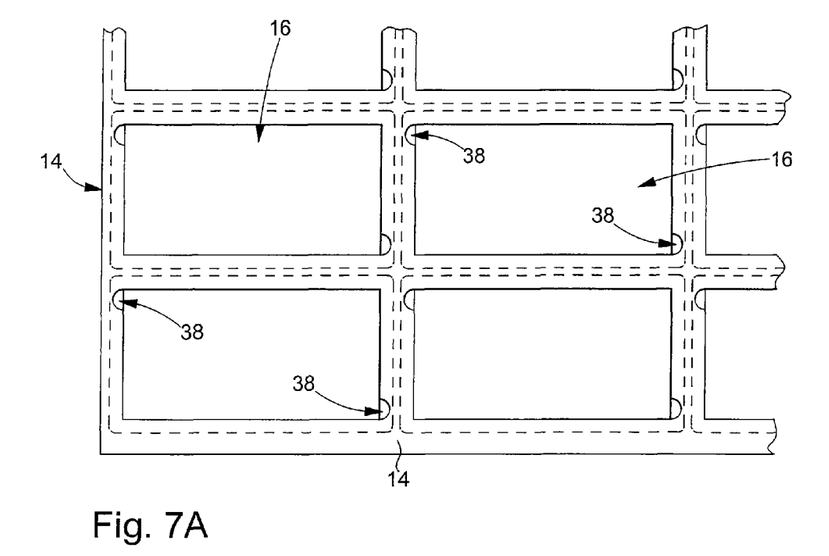
FIG. 7A is a partial top view of a plate involved in a third variant of the first embodiment of said assembly.
Figure 7B:
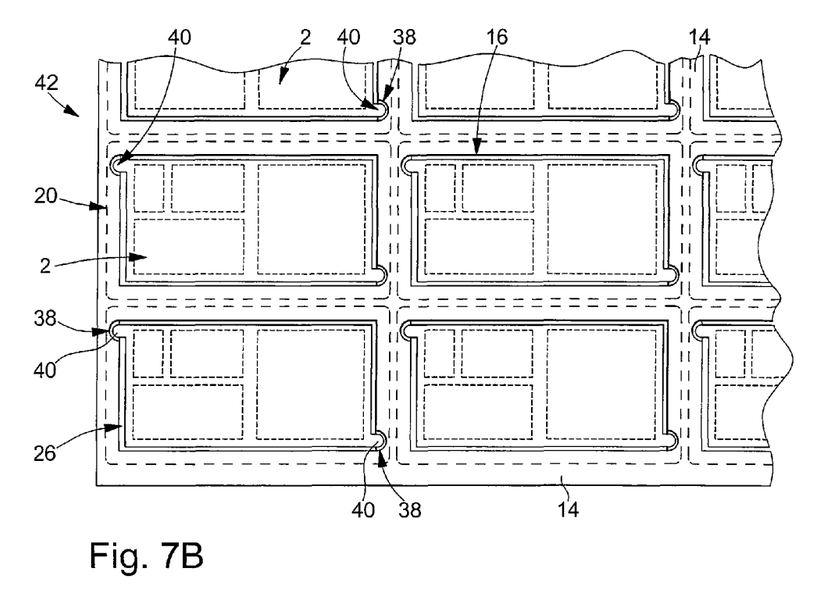
FIG. 7B is a partial top view of said third variant of the first embodiment of said assembly.

FIGS. 7A and 7B show an assembly according to a third variant of the first embodiment. Frame 14 includes a plurality of apertures 16. The peripheral area of each aperture has at least one notch 38 or preferably at least two notches 38. Each notch defines a small circular step. Electronic module 2 has projecting portions 40 at the edge thereof, which are partially superposed on notches 38 when module 2 is inserted in aperture 16. These projecting portions 40 rest on the small circular steps 38. Module 2 is assembled to plate 14 via zones 40, which are either welded, or bonded in notches 38. In a particular variant, the notches are sized such that projecting zones 40 have to be forcibly pushed into these notches, which secures electronic module 2 to plate 14. However, this latter variant has the drawback of requiring substrate 12 and notches 38 to be machined very precisely in the peripheral area of each aperture 16. It will be noted that the first and third variants can be combined, with projecting portions 18 then being superposed on projecting zones 40.

The various variants of the first embodiment of an assembly according to the invention, which have been described up until now, are characterized in that distinct zones on the edge of the electronic module, in particular on the substrate, are superposed on corresponding peripheral areas of the plate aperture, which houses said electronic module. The thickness of these peripheral areas is preferably smaller than that of the pierced plate. According to the invention, said edge zone and said peripheral area, which is superposed thereon, are assembled to each other so that the electronic module is secured in the plate aperture. The edge zone of the electronic module can directly abut against the corresponding peripheral area or be connected thereto via a resin film. Material connections are thus created between the electronic module and the pierced plate by means of specific zones on the edge of the electronic module, located opposite corresponding peripheral zones of the aperture, in which the electronic module is arranged.

FIG. 8 shows a fourth, particular variant of the first embodiment of an assembly of the invention. Assembly 44 is formed by a frame 14 that includes at least one aperture 16, which is separated into two secondary apertures by a crossbeam 46 whose thickness is less than that of plate 14. One could say that aperture 16 has two secondary apertures or equally that there are two apertures separated by a relatively narrow crossbeam. Electronic module 2 is arranged so that there are no electronic elements in a central area of substrate 12, which is superposed on crossbeam 46 once module 2 has been inserted in aperture 16. Module 2 is assembled to plate 14 via horizontal member 46, to which module 2 is, for example, welded or bonded. Other assembling means could be provided by those skilled in the art.

In all of the variants of the first embodiment of an assembly according to the invention that have been described, the thickness of the areas of plate 14 that are peripheral to apertures 16 is preferably smaller than the thickness of the plate in general. It will be noted that other variants with a plate of constant thickness could be envisaged. In such case, substrate 12 is located above plate 14, with the electronic elements in aperture 16.

Figure 9:
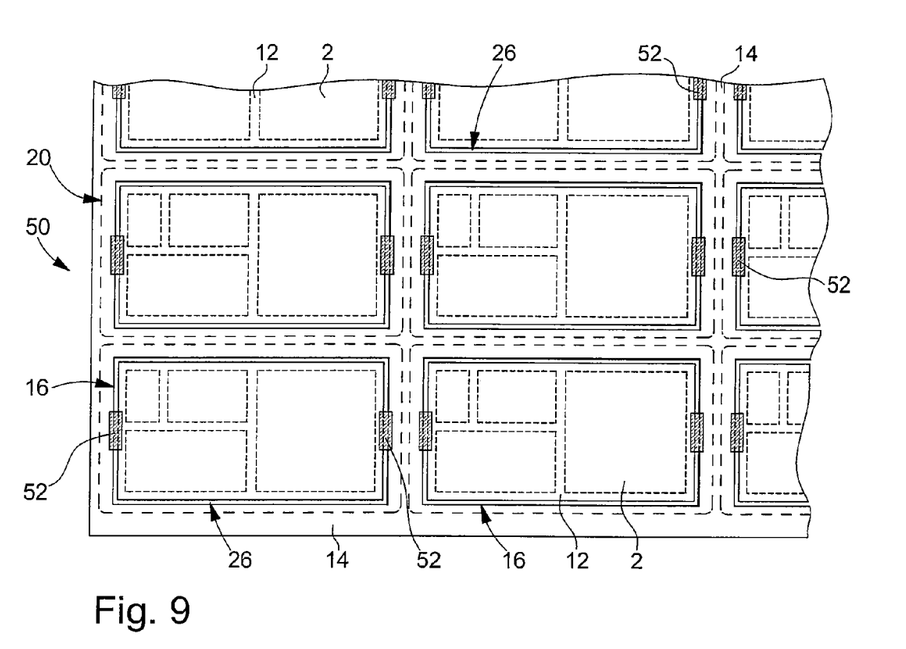
FIG. 9 is a partial top view of a second embodiment of the assembly according to the invention.

FIG. 9 shows a second embodiment of an assembly 50 according to the invention. The references that were described above will not be described again in detail here. This embodiment is characterized in that electronic module 2 is assembled to plate 14 via portions of adhesive strip 52, in particular two portions. In this embodiment, electronic module 2 is entirely contained within the corresponding aperture 16 and has no parts superposed on plate 14. The adhesive strip portions 52 define material connections between each electronic module and the pierced plate. These portions 52 can be arranged on either side of electronic module 2. In the example of FIG. 9, these portions 52 form a bridge between substrate 12 of module 2 and the peripheral area of aperture 16. These portions are arranged on the opposite side to the electronic elements carried by substrate 12. This example is in no way restrictive.

This second embodiment is characterized generally by the arrangement of strips formed of distinct material elements forming bridges between the edge of the electronic modules and the corresponding peripheral areas of the apertures housing the electronic modules. An "adhesive strip portion" means generally a strip portion with a surface that adheres both the plate 14 and to substrate 12. The adherence must be sufficient to hold the electronic module in the corresponding aperture 16 during transport and handling of assembly 50, and also during the steps of the card manufacturing method, in which this assembly 50 is produced as a constituent element in the batch of simultaneously manufactured cards.

Figure 10:
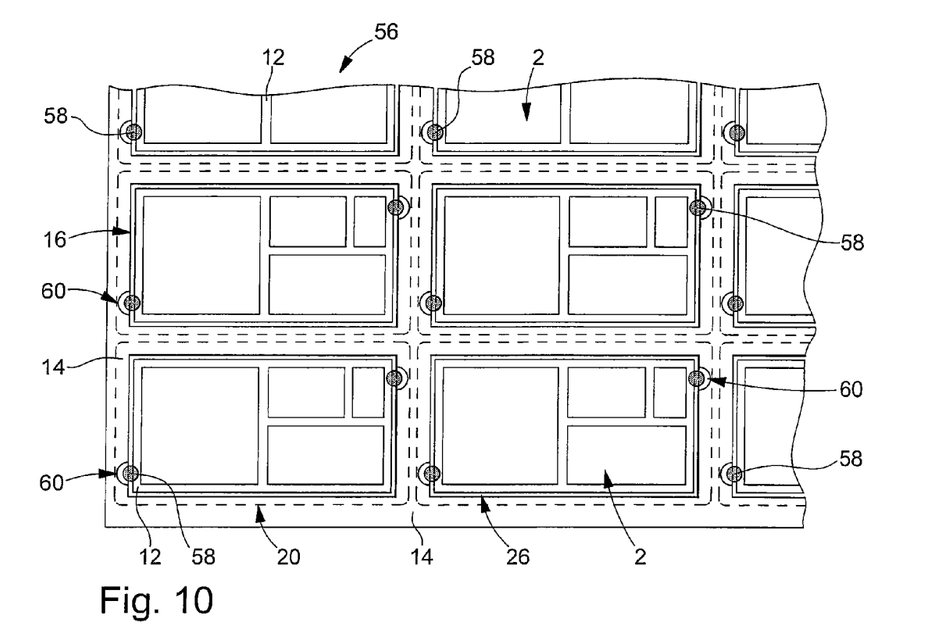
FIG. 10 is a partial top view of a variant of said second embodiment of said assembly.

FIG. 10 shows an advantageous variant of the second embodiment of an assembly 56. The material connection or bridge between the electronic module and the peripheral area of aperture 16 in plate 14 is achieved here via self-adhesive discs 58. The peripheral area of each aperture has notches 60 defining two small intermediate steps. The parts of self-adhesive discs 58 superposed on plate 14 are arranged inside these notches 60 in order to avoid creating any excessive thickness relative to frame 14. The depth of notches 60 can be relatively small, at least equal to the thickness of disc 58, or, conversely, their depth can be relatively large but less than the thickness of frame 14. The references that have already been described are not all described again here.

Figure 11:
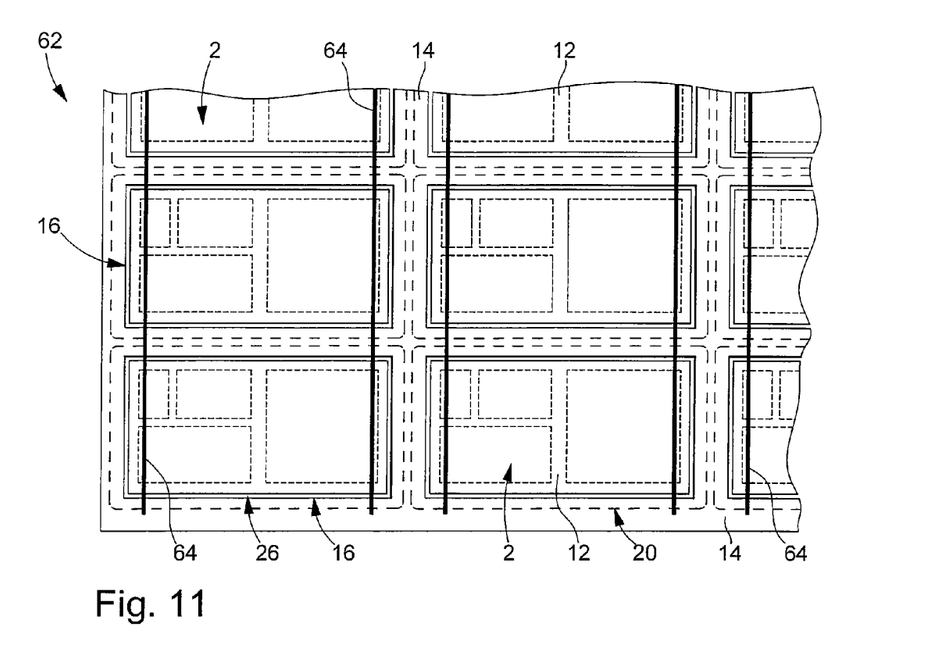
FIG. 11 is a partial top view of a third embodiment of an assembly according to the invention.

FIG. 11 shows a third embodiment of an assembly according to the invention. This assembly 62 also includes a pierced plate 14 and electronic modules 2 arranged in apertures 16. These modules 2 are assembled to plate 14 here by heat-reactivatable adhesive wires 64. These heat-reactivatable adhesive wires 64 pass through plate 14 and, in particular, apertures 16. Each heat-reactivatable adhesive wire 64 is arranged to adhere to plate 14 and to the modules 2 through which it passes. In the example shown in FIG. 11, each electronic module 2 is held in the corresponding aperture 16 by two wires 64 arranged in proximity to two opposite edges of the module. The heat-reactivatable adhesive wire 64 can be a wire made of synthetic or natural material, or covered with adhesive. In another variant, the wire itself is formed by a solid resin, which can be made to adhere by applying heat or ultra-violet light. Of course, in another variant, an adhesive strip that passes through apertures 16 can form wire 64. In another variant, the heat-reactivatable adhesive wires could pass grooves made in plate 14 between two adjacent apertures 16, to prevent the wires causing excessive thickness relative to plate 14.

Heat-reactivatable adhesive wires 64 can be added before or after the electronic modules, depending upon the arrangement anticipated. Likewise, the heat-reactivatable adhesive wires can be provided on the side of substrate 12 opposite the electronic elements carried by the substrate, as shown in FIG. 11, or located elsewhere, relative to substrate 12, on the same side as the electronic elements. The heat-reactivatable adhesive wire can adhere either to substrate 12 or to some of the electronic elements above which it is arranged. Those skilled in the art will understand that the possible variants are numerous. The assembly method here comprises an element that adheres to the electronic module and to plate 14 and passes through spaces 16 from a peripheral area to another peripheral area of each aperture 16. FIG. 11 shows the heat-reactivatable adhesive wires parallel to one edge of rectangular apertures 16, but the wires could very well be arranged obliquely, particularly along a diagonal direction of said apertures 16.

FIGS. 12 to 15 show two variants of a fourth embodiment of an assembly according to the invention. The references that have already been described previously will not be described again here in detail. This fourth embodiment differs in that electronic modules 2 are assembled to plate 14 by introducing a resin in slot 26 between module 2 and the corresponding aperture 16. In the variant shown in FIGS. 12 and 13, the adhesive is introduced, for example by using a syringe, into slot 26 so that a small strip of adhesive 70 forms an adherent bridge between the lateral wall 17 of aperture 16 and the edge of substrate 12 of the electronic module. This strip of adhesive can be added once the electronic module has been placed in the corresponding aperture in the plate or before the module is brought. In this latter case, a strip of adhesive is applied against lateral wall 17 of aperture 16. The strip of adhesive can be added in a viscous liquid state or in a paste like state, or even in a solid state and then made soft or viscous by applying heat. Strip 70 can be formed by any resin that adheres sufficiently well to frame 14 and the electronic module, in particular to the substrate 12 thereof, to hold the electronic module in the corresponding aperture and thus enable assembly 68 to be handled, without the electronic modules coming out of their respective apertures. The material connection made beforehand between the electronic module and plate 14 is important for holding the electronic module in a given position during the initial handling operations and also during the various steps of the method according to the invention, which will be described below.

Figures 12, 13:
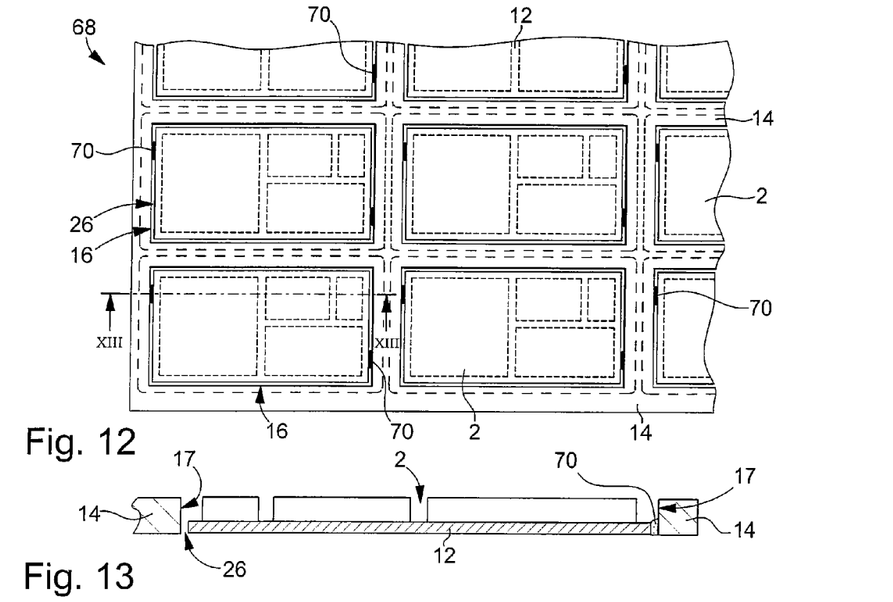
FIG. 12 is a partial top view of a fourth embodiment of an assembly according to the invention.
FIG. 13 is a partial cross-section along the line XIII-XIII of FIG. 12.

The variant of FIGS. 12 and 13 is characterized in that the strip of resin 70 defines a small bridge in slot 26, i.e. between the edge of substrate 12 and the lateral surface 17 of plate 14. This obviously does not mean that resin strip 70 cannot also extend partly over one or other of the top or bottom surfaces of substrate 12 and also over the top surface of plate 14. However, it will be noted that, preferably, the resin for securing the module is entirely inside aperture 16 and does not therefore cause any excessive thickness relative to the plate.

Figure 14:
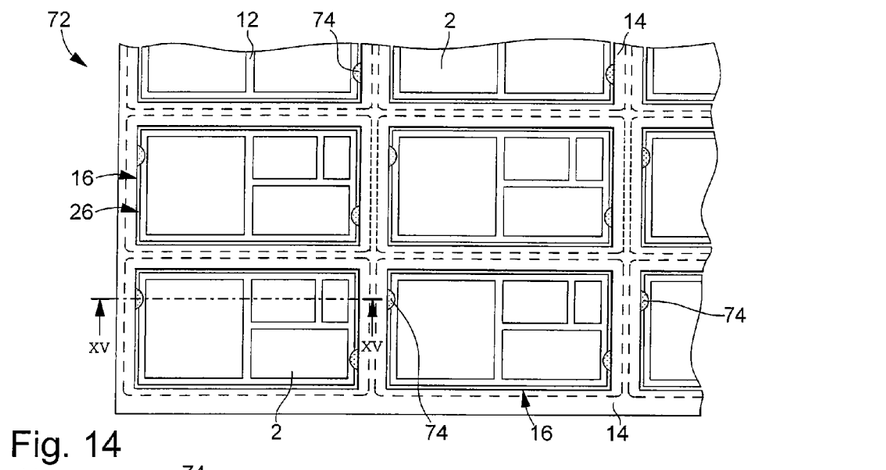
FIG. 14 shows schematically a partial top view of a variant of the fourth embodiment of said assembly.
Figure 15:
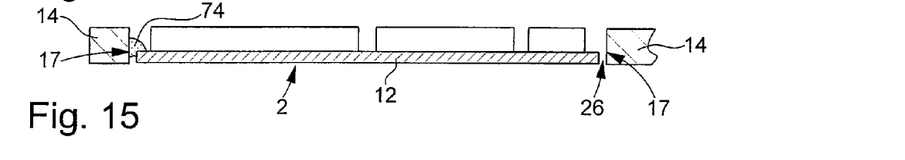
FIG. 15 is a partial cross-section along the line XV-XV of FIG. 14.

The variant shown in FIGS. 14 and 15 differs in that the assembly 72 includes drops of resin for securing electronic elements 2 to plate 14. These drops 74 are preferably added to the side of substrate 12 where the electronic elements are arranged. The drops of resin 72 form a joint essentially between the lateral wall 17 of aperture 16 and the top surface of substrate 12. This does not, however, mean that drop 74 flows into slot 26. The two variants of this fourth embodiment of an assembly according to the invention are thus relatively close to each other. In this fourth embodiment, a resin is applied locally to create a bridge or joint between the electronic module and the peripheral area of the corresponding aperture. This bridge or join is preferably located inside aperture 16 so that it does not cause any excessive thickness relative to the thickness of frame 14, which is approximately equal to the maximum thickness of electronic module 2.

It will be noted that the resin can be applied over several distinct edge zones of module 2. In FIGS. 12 and 14, the resin is only deposited in two diametrically opposite zones. Evidently, more zones could be provided, in particular, four zones approximately at the four corners of aperture 16. It will also be noted that the distinct zones can be relatively short as shown in FIGS. 12 and 14, or extend over a longer distance, for example, along the two small sides of rectangular aperture 16.

In all of the embodiments of the assembly according to the invention described above, the electronic module can have various configurations. This electronic module can have electronic elements on both sides of substrate 12 so that the substrate 12 is located in the median area of the corresponding aperture. Some elements can also be arranged in apertures in substrate 12 or at the periphery thereof, to prevent their respective thickness being added. In this latter case, it is also possible for an electronic element to pass through the substrate and come out of both sides of the substrate. Preferably, the thickness of plate 14 is approximately identical to the thickness of the electronic module; but this is not a compulsory requirement. Some elements, in particular an electronic display, have a greater thickness than that of plate 14. Finally, it will be noted that various embodiments and/or various variants could be combined with each other.

Two main variants of an intermediate product produced during the card manufacturing method according to the invention will be described below with reference to FIGS. 16 and 17.

Figure 16:
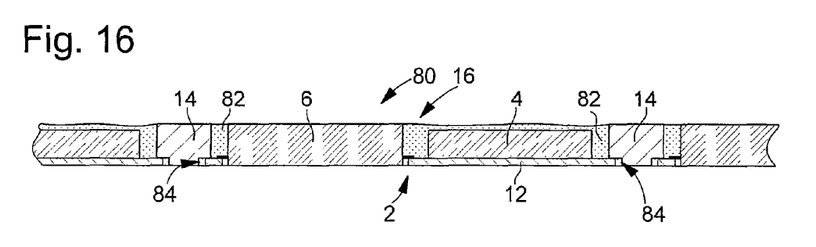
FIG. 16 is a partial cross-section of an intermediate product according to the present invention, which is produced in a method of manufacturing cards according to the present invention.

The intermediate product 80 shown in FIG. 16 is formed by an assembly according to the invention, said assembly including a pierced plate 14 and electronic modules housed in corresponding apertures 16. Substrate 12 of module 2 rests abutting against projecting parts arranged at the periphery of apertures 16, as described with reference to the first embodiment of an assembly according to the invention. Initially, electronic modules 2 and pierced plate 14 are assembled to each other by an adherent film provided between the projecting parts of plate 14 and substrates 12 of the electronic modules. In another variant, modules 2 are secured to plate 14 by adding drops of resin or strips of resin, in particular in the slot remaining between substrate 12 and wall 84. It will be noted in FIGS. 16 and 17 that the example chosen for the assembly according to the invention is given by way of non-limiting illustration. In fact, any assembly according to the invention can form an intermediate product by adding a filling material 82 in the space remaining in apertures 16. In the variant of FIG. 16, the filling material 82 approximately fills each aperture 16, without, however, covering the top and bottom surfaces of plate 14, or the surfaces of electronic display 6 that have the same thickness as plate 14. Filling material 82 fills at least most of the space remaining in apertures 16. This filling material is added in viscous liquid form and inserted in the apertures by various means available to those skilled in the art, in particular by casting pouring or any other technique known to those skilled in the art. It will be noted, in particular, that it is possible to envisage introducing filling material 82 by an injection technique, by pressing the mould cover on plate 14, the cover mastering the top surface of electronic display 6 during injection. One variant can be envisaged wherein electronic display 6 is also covered by the filling material, which is then transparent. Once again, the examples given are in no way restrictive. In the variant of FIG. 16, the filling material is added entirely through the top surface of frame 14, i.e. on the opposite side of substrate 12 to electronic module 2.

Filling material 82 can be formed by various suitable materials, which preferably have some elasticity once they have solidified. Preferably filling material 82 has a good adherence with the lateral walls of openings 16. In particular, a synthetic or natural resin forms material 82. By way of example, material 82 can be a polyurethane resin or a PVC resin. Material 82 could also be formed by an adhesive that hardens at ambient temperature or reacts, for example, to ultraviolet light (UV). In another variant that could be envisaged, material 82 could be formed by a gel or silicon-based material.

Figure 17:
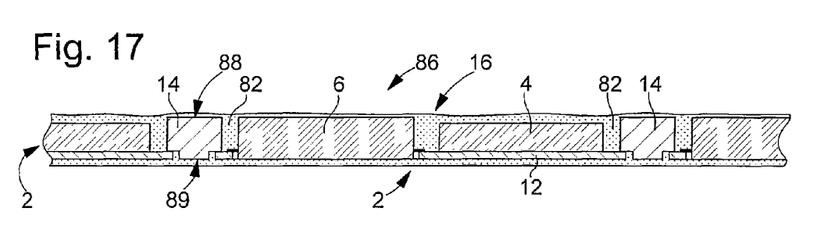
FIG. 17 is a partial cross-section of an alternative embodiment of an intermediate product according to the invention.

The intermediate product 86 shown in FIG. 17 differs from that of FIG. 16 in that filling material 82 is formed by a resin that covers at least the top surface 88 of plate 14, i.e. the surface on the side of which resin 82 was introduced. In the example of FIG. 17, resin 82 also covers bottom surface 89 of plate 14 and module 2, in particular, substrate 12. In another variant, plate 14 and the electronic modules are placed on a work surface or a worksheet as in the case of FIG. 16, and the resin is only introduced slowly, from above, into the space remaining in apertures 16. In such case, only top surface 88 of plate 14 and the top surface of display 6 will be covered. If electronic display 6 is covered by resin 82, this resin 82 will obviously be sufficiently transparent to allow the display to be read. As in the example of FIG. 16, electronic circuit 4 is covered by resin 82.

Once the resin has been added and distributed in apertures 16, a step is provided for solidifying the resin to form the intermediate product. In the example of FIG. 17, the assembly according to the invention is embedded in resin 82. However, in the example of FIG. 16, resin 82 does not define a through layer, but it is localised essentially in apertures 16 of plate 14. In FIGS. 16 and 17, the top surface of the solidified resin is slightly rippled, i.e. it has slight variations in thickness. This does not mean that the resin was only added by a casting technique, but it can indicate that, when the resin or filling material solidified, the material may have shrunk in a non-homogenous manner, given the presence of relatively bulky electronic elements, formed of various materials. Thus, the non-flat surface of intermediate product 86 can also result from a method wherein the resin is spread using a roller or blade, and even in the case where the resin is injected or spread in a press with flat surfaces. The intermediate product 86 can already be used to form a card or electronic token once it has been cut out, but its surface state can be improved within the scope of a method according to the invention, which will be described below.

Figure 18:
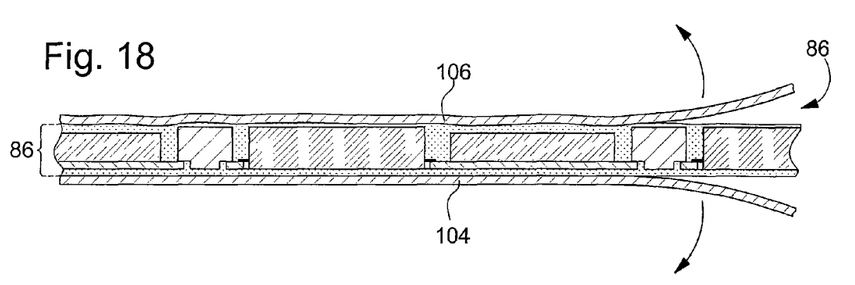
FIG. 18 is a partial cross-section of another alternative embodiment of an intermediate product according to the invention.

FIG. 18 shows an alternative embodiment of the intermediate product. This variant is characterized in that two worksheets are also provided on either side of the assembly according to the invention, i.e. covering the top and bottom surfaces of the resin layer. These worksheets 104 and 106 thus have poor adherence to resin 82 and facilitate the manufacture of the intermediate product. In fact, the resin is not then placed in contact with the surfaces of the manufacturing installation for the intermediate products according to the invention. The worksheets are removed once the resin has solidified. In another variant, a thin plastic film is provided on each side of the resin, which adheres securely to the resin. This film remains in the cards manufactured in accordance with the method described below.

Figure 19:
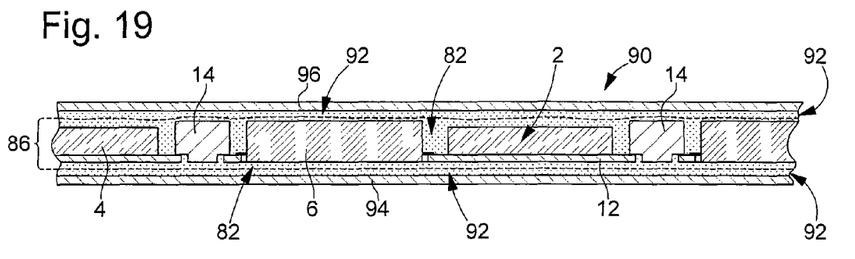
FIG. 19 is a partial cross-section of a card obtained according to a manufacturing method of the invention from the intermediate product shown in FIG. 17.

With reference to FIG. 19, we will describe below a method of manufacturing at least one card according to the invention. The steps in this method include:
  making an intermediate product according to the invention, for example intermediate product 80 of FIG. 16, or intermediate product 86 of FIG. 17;
  depositing a resin over at least one of the top and bottom surfaces of the intermediate product;
  applying pressure on the resin deposited on the intermediate product to spread the resin out and make said bottom and/or said top surface of the intermediate product level, said resin then being in a non-solid state and preferably viscous liquid, to compensate for any variations in thickness in the intermediate product.

FIG. 19 shows a plurality of cards that are batch manufactured in accordance with the method described below. After intermediate product 86 was made, two resin layers 92 have been added on either side of intermediate product 86, in addition to two external solid layers 94 and 96. Using a press, pressure is applied against external layers 94 and 96 so as to form a plurality of cards 90. The references that have already been cited will not be described again here in detail. If the intermediate product includes two external plastic films, the resin is then deposited above and the films are covered with resin on both sides.

It will be noted that there are various possible variants as regards the addition of resin 92 on either side of intermediate product 86. A first main variant consists in adding the resin in a viscous liquid state, either before or simultaneously with the addition of external layers 94, 96. The card according to the invention can be formed for example in a press with flat surfaces in which the various elements are placed, or using press rollers known to those skilled in the art. Resin 92 can be identical to the filling material or resin 82, used to form the intermediate product. However, a different resin that is suited to application in thin layers could very well be selected for layers 92. Moreover, a resin 92 that is particularly stable and has no significant shrink during solidification, will preferably be selected.

As is clear from FIG. 19, intermediate product 86 has a slightly rippled top surface. Resin 92 is distributed when pressure is applied so as to fill in the ripples in the intermediate product, to form a card, or a plurality of cards 90, whose external layers 94 and 96 have a perfectly flat surface. Manufacturing by adding the resin or filling material in two steps results in cards that have a given thickness and thus overcomes the flatness problems encountered in the manufacture of cards that have relatively large electronic modules or elements inside, in particular electronic elements whose thickness is variable, which cause variable resin thickness inside the card. The resin can be added to the intermediate product and pressure can be applied above in several successive steps. Thus, during the first application of resin, two worksheets are preferably used, and then removed once resin layers 92 have solidified. A second resin layer can then be added above to further improve the flatness of the card. As already mentioned, a multi-layered structure with thin plastic films between two depositions of thin resin layers, could also be provided.

According to a second main variant, the resin layers 92 are added in the form of solid resin sheets, which are then at least partially melted prior to or simultaneously with the application of pressure to form the finished cards. The resin sheets are thus sufficiently soft and easily deformed for the resin to be able to spread and fill the surface unevenness of the intermediate product 86, in order to form a high quality flat card. Heat can be applied by various means and, in particular, via the actual press. Finally, resin 92 can also be solidified in various ways, depending upon the features of the resin. The resin can solidify at ambient temperature, or by other means known to those skilled in the art, particularly by a chemical reaction or polymerisation with thermosetting materials.

It will be noted that the finished card 90 can include several external layers and transparent protective layers, for example, to protect any printing performed on layer 94 or 96. Generally, any intermediate product and any card obtained within the scope of the present invention, can then be laminated with a variable number of plastic layers, without using any additional resin. An intermediate layer that has been laminated with external layers in this way can form finished cards after the cutting operation.

Figure 20:
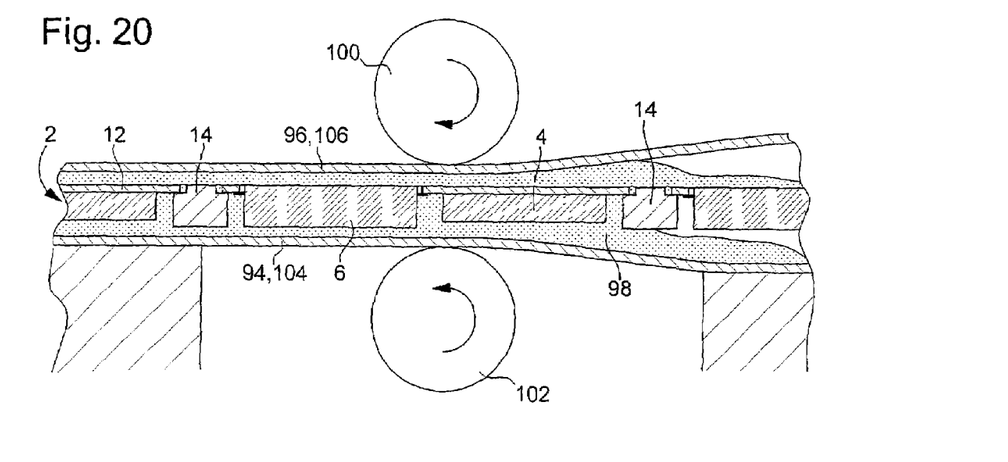
FIG. 20 shows schematically another implementation of the card manufacturing method of the invention. This method can also being be applied to make an intermediate product according to the present invention.
Figure 21:
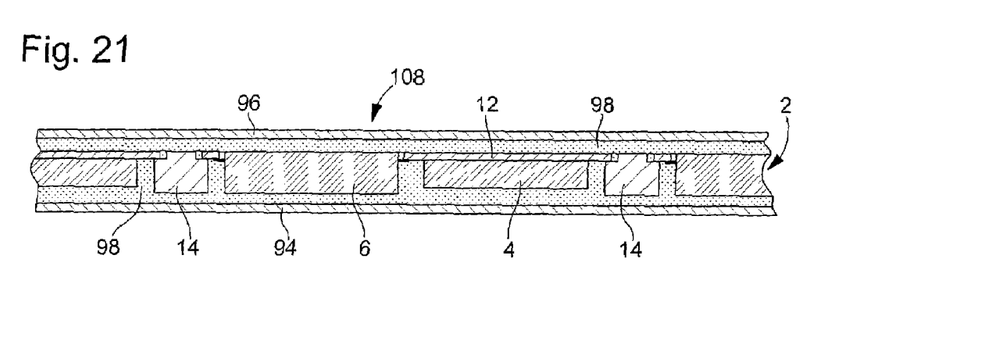
FIG. 21 is a partial cross-section of a plurality of cards that result from the method described in FIG. 20.
Figure 22:
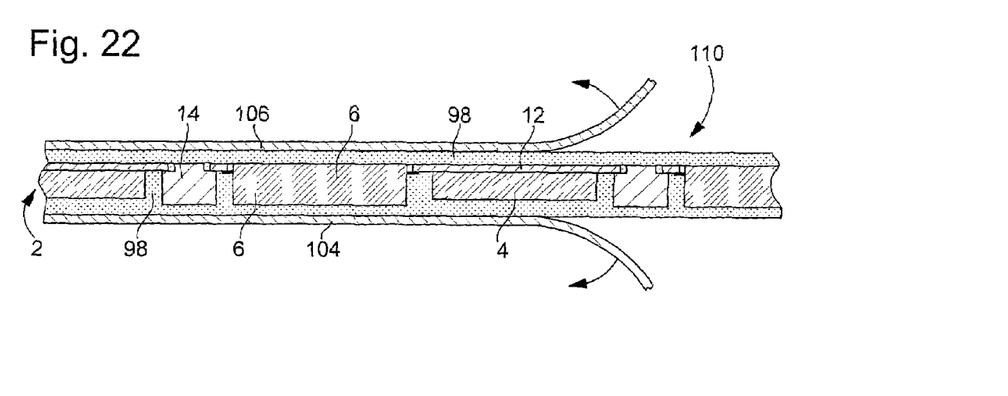
FIG. 22 shows schematically an alternative embodiment of a plurality of cards or intermediate products that also result from the method described in FIG. 20.

With reference to FIGS. 20 to 22, we will describe another implementation of the card or intermediate product manufacturing method according to the invention. In this implementation, one may take any assembly according to the invention, formed of a pierced plate 14 and electronic modules, in particular a display 6 and an electronic circuit 4 mounted on a substrate 12. As in FIGS. 16 and 17, the electronic display is arranged in an aperture of substrate 12 or at the periphery thereof. It is secured to the substrate by connecting pins or other connecting or securing means. This assembly according to the invention is provided with a resin 98, in a viscous liquid state, between two solid layers 94 and 96, respectively 104 and 106 in an installation provided with press rollers 100 and 102, between which the various elements are continuously introduced. Rollers 100 and 102 preferably rotate freely and the assembly formed of the electronic modules and the pierced plate, and the external layers, are pulled. This implementation is not restrictive, but has the advantage of allowing the assembly according to the invention and the external layers in contact with press rollers 100 and 102 to move forward in an identical way. Resin 98 is preferably added to bottom layer 94, or respectively top layer 104 and over the assembly according to the invention. This is in no way restrictive and any other way of adding the resin that allows the electronic assembly to be properly embedded or coated could be used by those skilled in the art. The installation supports have been shown entirely schematically and do not form any particular feature of the method of the invention.

It will be noted that press rollers 100 and 102, and the arrangement thereof in the card manufacturing installation, have been shown schematically. It is possible to provide several pairs of press rollers arranged one after the other or other similar means of pressure, for example a continuous press fitted with a conveyor belt. These pairs of rollers can have different diameters and the distance between the rollers of one pair can also be different. In particular, the distance between the press rollers could decrease in the direction of movement of the elements that pass through the press rollers. Thus, the thickness gradually decreases between external layers 94 and 96, or 104 and 106 respectively. This enables the resin 98 to be better distributed to obtain improved flatness for the manufactured cards.

Means other than press rollers could be provided, for example blades for spreading out the resin and distributing it in the remaining spaces in the apertures in the pierced plate and on either side of the assembly of the invention.

FIG. 21 shows a batch of cards obtained by the method described above. Cards 108 thus include an electronic module connected to a pierced plate 14 and coated with resin 98. These cards include two external solid layers 94 and 96, which have approximately flat surfaces. These layers 94 and 96 adhere properly to resin 98, so that they form part of the finished cards. In a known manner, each card is cut out of the batch of simultaneously manufactured cards using a cutting tool or by means known to those skilled in the art, particularly using a jet fluid.

FIG. 22 shows an intermediate product or a batch of cards 110 obtained by the manufacturing method described with reference to FIG. 20. Here, solid layers 104 and 106 form worksheets that do not adhere well to resin 98 so that these sheets 104 and 106 are removed once resin 98 has solidified. An intermediate product, or batch of cards is thus obtained, whose body is formed by resin 98, the external surfaces of the resin then defining the external surfaces of the product obtained. According to various variants, other external layers can be subsequently added, by laminating either side of the intermediate product 110. Likewise, the cards 108 shown in FIG. 21 can also receive other external layers, in particular a printing layer and a final transparent protective layer. The cards can be individually cut before or after these additional layers are added.

In another implementation of the method described here, the intermediate product or cards can be formed in a press that has flat surfaces. All of the elements are added between these surfaces before any pressure is exerted to form the intermediate products or approximately flat cards. It will be noted that it is possible, firstly, to use press rollers and then to place the product obtained in a press with a flat surface until the resin solidifies. It will be noted finally, that resin 98 is preferably added in a viscous liquid state. However, in a variant, it is possible to add the resin or any other filling material in a solid state and then to melt it so that it can then fill the remaining spaces in the apertures in pierced plate 14 and thus form compact and substantially full cards, i.e. cards that have a relatively low level of residual air.

The invention claimed is:

1. An assembly forming a preliminary intermediate product obtained in a manufacture of one or more cards during which the assembly is brought in an installation where a first resin or filling material is provided for partially conning the one or more cards, wherein the assembly comprises:
   i. at least one electronic module;
   ii. a plate having at least one through aperture, wherein the at least one electronic module is electrically independent of the plate and is at least partially housed in the at least one through aperture,
   wherein the at least one electronic module is secured to the plate by means for securing the at least one electronic module to the plate that is incorporated in the manufactured one or more cards; and
   iii. a through slot provided between each electronic module and a lateral wall of a corresponding through aperture, wherein the at least one electronic module and the means for securing the at least one electronic module to the plate are arranged to define the through slot, wherein the means for securing the at least one electronic module to the plate interrupts or crosses the through slot, and wherein the through slot defines at least partially a remaining space in the corresponding through aperture, wherein the remaining space is open on at least one side of the plate, and wherein the at least one electronic module remains in the at least one through aperture in a substantially defined position relative to the plate until the assembly is brought in the installation where the first resin or the filling material is added to at least one side of the at least one electronic module so as to substantially fill the through slot and until the first resin or the filling material is solidified.

2. The assembly according to claim 1, wherein, at a periphery of each through aperture, the plate has at least one projecting portion having a smaller thickness than a thickness of the plate and superposed on an edge zone of the at least one electronic module housed in the corresponding through aperture, wherein the edge zone is bound to the projecting portion in order to secure the at least one electronic module to the plate.

3. The assembly according to claim 1, wherein each electronic module has at least one projecting zone superposed on a peripheral area of the corresponding through aperture in the plate, wherein the projecting zone is bound to the peripheral area to secure the electronic module to the plate.

4. The assembly according to claim 3, wherein the peripheral area is defined by a notch, and the notch defines an intermediate step whose thickness is less than a thickness of the plate.

5. The assembly according to claim 1, wherein each through aperture is separated into two secondary through apertures by a cross-beam superposed on the at least one electronic module housed in the corresponding through aperture, wherein the cross-beam is secured to the at least one electronic module to fix the at least one electronic module to the plate.

6. The assembly according to claim 5, wherein the thickness of the cross-beam is less than a thickness of the plate.

7. The assembly according to claim 1, wherein each electronic module is assembled to the plate by adhesive fasteners.

8. The assembly according to claim 7, wherein the adhesive fasteners are formed by pieces of an adhesive strip or adhesive discs.

9. The assembly according to claim 8, wherein the adhesive fasteners are secured to the plate in notches provided at a periphery of each aperture.

10. The assembly according to claim 7, wherein the adhesive fasteners are formed by wires or thermoadhesive strips that cross the at least one through aperture and connect the at least one electronic module housed in the corresponding through aperture to the plate.

11. The assembly according to claim 1, wherein each electronic module is connected to the plate via drops of resin or strips of resin that define material bridges between the electronic module and the plate.

12. The assembly according to claim 1, wherein each electronic module has a substrate that carries electronic elements, wherein the electronic module is assembled to the plate via the substrate.

13. An intermediate product produced during a manufacture of at least one card, comprising:
   the assembly according to claim 1; and
   a first resin or a filling material, wherein the first resin or the filling material fills at least most of the remaining space in each through aperture and substantially fills the through slot between each electronic module and the lateral wall of the corresponding through aperture.

14. The intermediate product according to claim 13, wherein the plate has a top and a bottom surface and the intermediate product further includes a covering resin that covers at least one of the top and bottom surfaces of the plate.

15. The intermediate product according to claim 14, wherein the first resin or the filling material and the covering resin are formed by a same substance.

16. The intermediate product according to claim 15, wherein at least one solid layer covers the covering resin, wherein the solid layer forms a worksheet that does not adhere well to the covering resin and is subsequently removed during the card manufacture so that the worksheet is not included in the finished card.

17. The intermediate product according to claim 14, wherein at least one solid layer covers the covering resin, and wherein the at least one solid layer forms a worksheet that does not adhere well to the covering resin and is subsequently removed during the card manufacture so that the worksheet is not included in the finished card.

18. A method of making an intermediate product obtained in a manufacture of at least one card during which a first resin or a filling material is provided for partially forming the intermediate product, wherein the method comprises the following steps:
(a) making an assembly, wherein the assembly is the assembly according to claim 1;
(b) introducing the first resin or the filling material in a viscous liquid state into the remaining space of each through aperture, so that the through slot between each electronic module and the lateral wall of the corresponding through aperture is substantially filled by the first resin or by the filling material;
(c) solidifying the first resin or the filling material.

19. The method according to claim 18, wherein the plate has a top and a bottom surface and a covering resin is deposited over at least one of the top and bottom surfaces of the plate.

20. The method according to claim 19, wherein the first resin or filling material and the covering resin are formed by a same substance and are added simultaneously.

21. The method according to claim 20, wherein the first resin or the filling material and the covering resin are spread out using at least one roller or a blade that moves relative to the assembly so that, after hardening, the covering resin has an approximately flat external surface.

22. The method according to claim 19, wherein at least one solid layer is added onto the covering resin.

23. The method according to claim 22, wherein the solid layer is a worksheet that does not adhere well to the covering resin and is subsequently removed.

24. The method according to claim 22, wherein the solid layer forms a layer of the at least one manufactured card and adheres securely to the covering resin.

25. The method according to claim 18, wherein the first resin or the filling material is spread out using at least one roller or a blade that moves relative to the assembly so that, after hardening, the first resin or the filling material fully fills the remaining space of each through aperture.

26. The method according to claim 19, wherein the first resin or the filling material and the covering resin are spread out using at least one roller or a blade that moves relative to the assembly so that, after hardening, the covering resin has an approximately flat external surface.

27. A method of manufacturing at least one card including the following steps:
(a) making the intermediate product with a top and a bottom surface in accordance with claim 18;
(b) depositing a second resin over at least one of the top and bottom surfaces of the intermediate product;
(c) applying pressure on the second resin, wherein the second resin is then in a non-solid state to form the at least one card with a flat external surface and compensates for variations in thickness in the intermediate product; and
(d) solidifying the second resin.

28. The method according to claim 27, wherein steps of depositing the second resin, applying pressure to the second resin in a non-solid state and solidifying the second resin are carried out at least twice in succession.

29. The method according to claim 27, wherein the second resin is added in a viscous liquid state.

30. The method according to claim 27, wherein the deposited second resin is covered by at least one worksheet that does not adhere well to the second resin and is removed after the second resin has solidified.

31. The method according to claim 27, wherein there is a final step of adding at least one solid external layer onto the second resin, wherein the solid layer adheres securely to the second resin after the second resin has solidified.

32. The method according to claim 28, wherein there is a final step of adding at least one solid external layer onto the second resin, wherein the solid layer adheres securely to the second resin after the second resin has solidified.

33. The method according to claim 28, wherein the deposited second resin is covered by at least one worksheet that does not adhere well to the second resin and is removed after the second resin has solidified.

34. The method according to claim 28, wherein the second resin is added in a viscous liquid state.

35. A method of manufacturing at least one card including the following steps:
(a) making the intermediate product with a top and a bottom surface in accordance with the method of claim 19;
(b) depositing a second resin over at least one of the top and bottom surfaces of the intermediate product;
(c) applying pressure on the second resin, wherein the second resin is then in a non-solid state to compensate for variations in thickness in the intermediate product; and
(d) solidifying the second resin.

36. The method according to claim 35, wherein the deposited second resin is covered by at least one worksheet that does not adhere well to the resin and is removed after the second resin has solidified.

37. The method according to claim 35, further comprising the step of:
(e) adding at least one solid external layer onto the second resin, wherein the solid external layer adheres securely to the second resin after the second resin has solidified.

* * * * *